United States Patent
Leng

(10) Patent No.: US 11,950,449 B2
(45) Date of Patent: Apr. 2, 2024

(54) DISPLAY PANEL WITH A DISPLAY FUNCTION LAYER AND DISPLAY DEVICE

(71) Applicant: Xiamen Tianma Micro-Electronics Co., Ltd., Xiamen (CN)

(72) Inventor: Chuanli Leng, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 329 days.

(21) Appl. No.: 17/330,438

(22) Filed: May 26, 2021

(65) Prior Publication Data
US 2022/0165993 A1 May 26, 2022

(30) Foreign Application Priority Data
Nov. 20, 2020 (CN) .......................... 202011311386.X

(51) Int. Cl.
| | |
|---|---|
| H10K 50/854 | (2023.01) |
| H10K 50/80 | (2023.01) |
| H10K 50/844 | (2023.01) |
| H10K 50/86 | (2023.01) |
| H10K 59/122 | (2023.01) |

(52) U.S. Cl.
CPC ......... *H10K 50/854* (2023.02); *H10K 50/844* (2023.02); *H10K 50/865* (2023.02); *H10K 50/868* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 10,439,167 B2* | 10/2019 | Jo ........................ | H10K 50/81 |
| 2007/0200492 A1* | 8/2007 | Cok ...................... | H10K 59/38 |
| | | | 313/506 |
| 2013/0320842 A1* | 12/2013 | Park ...................... | H10K 59/38 |
| | | | 313/512 |
| 2015/0194474 A1* | 7/2015 | Choi ................ | G02F 1/133603 |
| | | | 445/6 |
| 2017/0154930 A1* | 6/2017 | Kim ...................... | H10K 59/38 |
| 2017/0155093 A1* | 6/2017 | Jo ........................ | H10K 50/84 |

(Continued)

FOREIGN PATENT DOCUMENTS

| | | |
|---|---|---|
| CN | 106992199 A | 7/2017 |
| CN | 109686868 A | 4/2019 |

(Continued)

*Primary Examiner* — Evren Seven
(74) *Attorney, Agent, or Firm* — KILPATRICK TOWNSEND & STOCKTON LLP

(57) ABSTRACT

Provided are a display panel and a display device. The display panel includes a substrate, a display function layer, a first function layer, a scattering structure and a light shielding structure. The display function layer is located on a side of the substrate. The first function layer is located on a side of the display function layer facing away from the substrate. The scattering structure is located between the display function layer and the first function layer in a direction perpendicular to a plane where the substrate is located. The scattering structure is located in the non-light emitting region. The light shielding structure is located in the non-light emitting region. The light shielding structure at least overlaps the scattering structure in the direction perpendicular to the plane where the substrate is located.

20 Claims, 9 Drawing Sheets

(56) References Cited

U.S. PATENT DOCUMENTS

| | | | | |
|---|---|---|---|---|
| 2018/0061894 A1* | 3/2018 | Kim | ............... | H10K 50/865 |
| 2018/0069061 A1* | 3/2018 | Riedel | ............. | H10K 50/865 |
| 2018/0160552 A1* | 6/2018 | Choi | .............. | H10K 50/854 |
| 2019/0296265 A1* | 9/2019 | Um | ................ | H10K 50/841 |
| 2020/0266243 A1* | 8/2020 | Kim | ................. | H10K 59/12 |
| 2021/0313400 A1* | 10/2021 | Bae | ................ | H10K 59/122 |
| 2021/0391395 A1* | 12/2021 | Shin | ............... | H10K 50/115 |

FOREIGN PATENT DOCUMENTS

| | | |
|---|---|---|
| CN | 110707132 A | 1/2020 |
| CN | 110910770 A | 3/2020 |

\* cited by examiner

DISPLAY PANEL WITH A DISPLAY FUNCTION LAYER AND DISPLAY DEVICE

CROSS-REFERENCE TO RELATED APPLICATION

This application claims priority to a Chinese patent application No. 202011311386.X filed on Nov. 20, 2020, the disclosure of which is incorporated herein by reference in its entirety.

TECHNICAL FIELD

The present disclosure relates to the field of display technologies and, in particular, to a display panel and a display device including the display panel.

BACKGROUND

With the popularization and development of information, people's demands for display devices are gradually increasing. Therefore, a liquid crystal display (LCD) device, an organic light emitting display (OLED) device, a micro-light emitting display (micro-LED) device and other various display devices are used recently.

The OLED device is a self-luminous display device. Compared with other devices, the OLED device has a better viewing angle and a better contrast. The OLED device is light and thin and performs well in power consumption. Since driven by a low direct current (DC) voltage, the OLED device has a fast response speed and low manufacturing costs.

However, there are many films on a light emitting side of a light emitting component of the OLED device, so light emitted by pixels is totally reflected if at a large viewing angle, thus reducing the light emission efficiency of the OLED device.

In view of this, how to effectively improve the light emission efficiency of the OLED device becomes a focus of research and development of the OLED device.

SUMMARY

The present disclosure provides a display panel. The display panel includes a display region, a substrate, a display function layer, a first function layer, a scattering structure and a light shielding structure. The display region includes a light emitting region and a non-light emitting region. The non-light emitting region surrounds the light emitting region. The display function layer is located on a side of the substrate. The first function layer is located on a side of the display function layer facing away from the substrate. The scattering structure is located between the display function layer and the first function layer in a first direction. The scattering structure is located in the non-light emitting region. The first direction is perpendicular to a plane where the substrate is located. The light shielding structure is located in the non-light emitting region. The light shielding structure at least overlaps the scattering structure in the first direction.

The present disclosure further provides a display device including the display panel. The display panel includes a substrate; a display function layer, which is located on a side of the substrate; a first function layer, which is located on a side of the display function layer facing away from the substrate; a scattering structure, which is located between the display function layer and the first function layer in a first direction, and the first direction is perpendicular to a plane where the substrate is located; and a light shielding structure, which at least overlaps with the scattering structure in the first direction. The display panel has a display region, the display region comprises a light emitting region and a non-light emitting region surrounding the light emitting region; and the scattering structure is located in the non-light emitting region, and the light shielding structure is located in the non-light emitting region.

DETAILED DESCRIPTION

Figure 1:
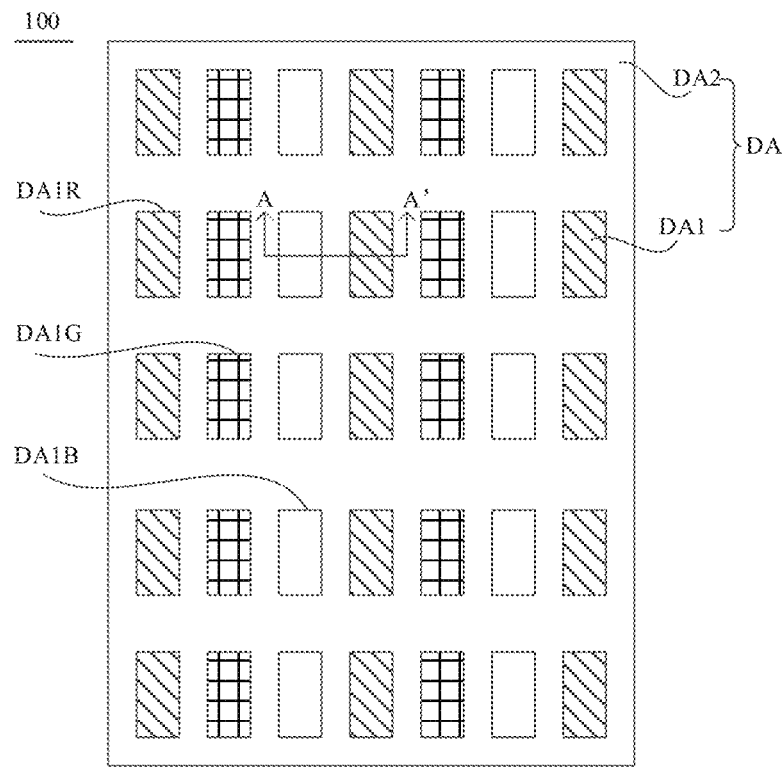
FIG. 1 is a top view of a display panel according to the present disclosure.

It is to be noted that details are set forth below to facilitate a thorough understanding of the present disclosure. However, the present disclosure may be implemented by various embodiments different from the embodiments described herein. Therefore, the present disclosure is not limited to the embodiments disclosed below. Additionally, in the description below, the same reference numerals in the drawings denote the same or similar structures, and thus a description of the same reference numerals is not repeated. Moreover, different features in various embodiments may be combined with each other.

An organic light emitting display panel usually includes a substrate, an array layer, a light emitting layer, an encapsulation layer, a touch layer, a cover plate, an adhesive layer between various film layers and other film layers stacked in sequence. It is to be understood that various film layers are made of different materials, so there is usually a refractivity difference between the various film layers. When light emitted from the light emitting layer exits outside the display panel from a light emitting side of the display panel, the light is refracted and reflected many times by the various film layers. When an emission angle of the light is larger and the refractivity difference between film layers is larger, and the light is incident from an optically dense medium to an optically thinner medium, the emitted light is be totally reflected on a film interface. For example, when light is emitted from the cover plate (whose refractivity is about 1.5) of the display panel into air (whose refractivity is about 1), light having an emission angle about 40° is totally reflected on a surface of the display panel, so the light emission efficiency of the display panel is reduced, and higher energy consumption is required under the same display brightness.

It is to be noted that the emission angle of light mentioned in the present disclosure refers to an included angle between an emission direction of emitted light of the display panel and a normal direction of the display panel.

Figure 2:
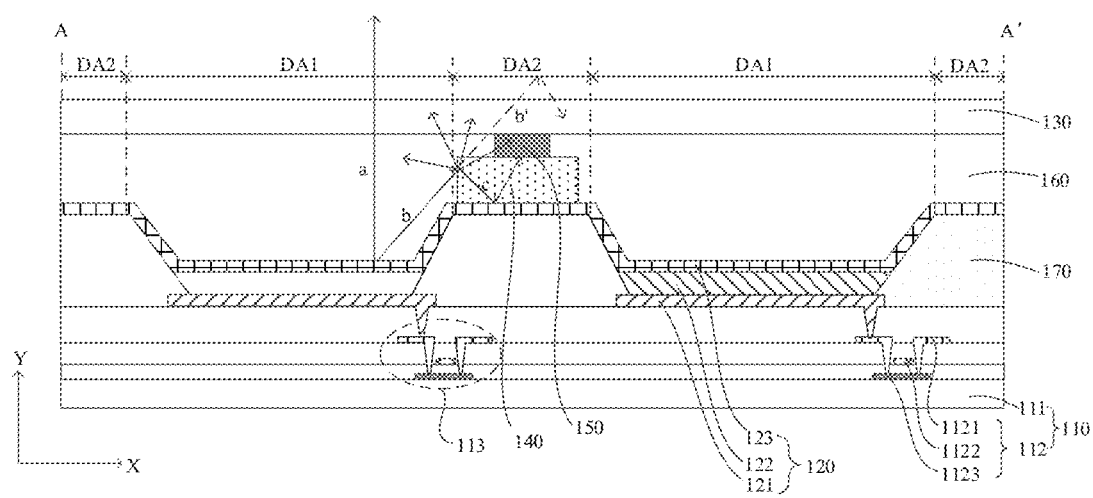
FIG. 2 is a partial cross-sectional view of the display panel along section line AA' of FIG. 1.

In view of the preceding problems, the present disclosure provides a display panel. In an embodiment of the present disclosure, referring to FIGS. 1 and 2, FIG. 1 is a top view of a display panel according to the present disclosure, and FIG. 2 is a partial cross-sectional view of the display panel along section line AA' of FIG. 1. A display panel 100 of the present disclosure includes a display region DA, a substrate 110, a display function layer 120, a first function layer 130, a scattering structure 140 and a light shielding structure 150. The display region DA includes a light emitting region DA1 and a non-light emitting region DA2. The non-light emitting region DA2 surrounds the light emitting region DA1. The display function layer 120 is located on a side of the substrate 110. The first function layer 130 is located on a side of the display function layer 120 facing away from the substrate 110. The scattering structure 140 is located between the display function layer 120 and the first function layer 130 in a first direction Y and is located in the non-light emitting region DA2. The first direction Y is perpendicular to a plane where the substrate 110 is located. The light shielding structure 150 is located in the non-light emitting region DA2. The light shielding structure 150 at least overlaps with the scattering structure 140 in the first direction Y.

The light shielding structure 150 overlaps the scattering structure 140 in the first direction Y. In this case, the light shielding structure 150 may be located on a side of the scattering structure 140 close to the substrate 110, or may be located on a side of the scattering structure 140 away from the substrate 110. In some embodiments, the light shielding structure 150 may further be located inside the scattering structure 140, or at least partially surrounded by the scattering structure 140. The embodiments are further described below.

It is to be noted that the display panel of the present disclosure may further include a non-display region at least partially surrounding the display region DA. The non-display region is not shown in the drawings. Still referring to FIG. 2, the substrate 110 of the present disclosure includes a base layer 111 and an array layer 112. The array layer 112 includes a driver circuit 113. The driver circuit 113 is configured to drive the display function layer 120 to emit light. The array layer 112 includes at least a source/drain metal layer 1121, a gate metal layer 1122, an active layer 1123, an insulating layer between the various metal layers, and the like. The display function layer 120 further includes an anode 121, a light emitting layer 122 and a cathode 123. Multiple scanning lines and multiple data lines are intersected in the display region DA of the display panel 100. The display panel further includes an encapsulation layer, a touch layer, a cover plate and other film layers above the display function layer 120. To facilitate a clear description of the solution of the present disclosure, merely a part of the film layers and structures of the display panel are shown in the drawings.

It is to be understood that, still referring to FIG. 2, the display panel 100 includes a pixel definition layer 170. The pixel definition layer 170 defines the light emitting region DA1 and the non-light emitting region DA2 of the display panel. For example, a location where the pixel definition layer 170 is provided with an opening is the light emitting region DA1, and a location where an opening is not disposed is the non-light emitting region DA2. The display function layer 120 may emit light of a specific color (wavelength). Still referring to FIG. 1, light emitting regions DA1 may include a red light emitting region DA1R emitting red light, a green light emitting region DA1G and a blue light emitting region DA1B. In an embodiment of the present disclosure, the light emitting regions DA1 may further include a white light emitting region DA1W (not shown in FIG. 1). Each light emitting region DA1 may serve as one or more sub-pixels.

In this embodiment of the present disclosure, still referring to FIG. 2, the scattering structure 140 is disposed on a light emitting side of the display panel 100 and located in the non-light emitting region DA2. The scattering structure 140 scatters light having a large viewing angle and emitted from the display function layer 120, and thus changes the light emission angle of the light having a large viewing angle originally thereby increasing the light emission efficiency of the display panel. It is to be understood that if the scattering structure 140 overlaps the light emitting region, light originally emitted at a front viewing angle is scattered, thereby reducing the light emission efficiency of the display panel 100 instead. In this embodiment, light is emitted from the light emitting region DA1 in a manner of top emission, and the light emission direction of the display panel 100 is the same as the first direction Y illustrated in FIG. 2. That is, the light emission direction is from the substrate 110 to the display function layer 120. In some embodiments of the present disclosure, light may be emitted from the light emitting region DA1 in a manner of bottom emission. In this case, the light emission direction of the display panel 100 is from the display functional layer 120 to the substrate 110. In the present disclosure, if an included angle between a light emission direction of emitted light and a normal direction of the display panel 100 is less than or equal to a preset included angle, it is regarded that the emitted light has a front viewing angle, where the preset included angle usually ranges from 40° to 60°. For example, light a in FIG. 2 has a front viewing angle. If an included angle between a light emission direction of light and the normal direction of the display panel 100 is greater than the preset angle, it is regarded that the light has a large viewing angle. For example, light b in FIG. 2 has a large viewing angle. When the scattering structure 140 is not disposed, light b is emitted to a surface of the display panel 100 along path b'. Since the emission angle is too large, light b is totally reflected on the surface of the display panel and thus cannot exit outside the display panel. In an embodiment of the present disclosure, the light shielding structure is configured to overlap with the scattering structure in the non-light emitting region. This helps to shield unnecessary scattered light, such as light c reflected in the non-light emitting region DA2 after the light having a large viewing angle in the light emitting region DA1 is scattered by the scattering structure 140 and thus changes a propagation direction; or the light emitted to the light emitting side of the display panel 100 after ambient light is incident into the display panel 100, changes a polarization direction by the scattering structure 140 in the non-light emitting region DA2 and then is reflected in the non-light emitting region, thereby avoiding increasing reflected light of the display panel and affecting the display quality of the display panel.

It is to be noted that, in the present disclosure, the scattering structure 140 may be a structure where scattering particles are distributed within an organic layer. The scattering particles may silica, titanium oxide and other materials. The organic layer may include one or more of acrylic resin, polystyrene resin, styrene-acrylic copolymer resin, polyethylene resin, epoxy resin, silicone resin, silicone rubber and other materials. The light shielding structure 150 may include a black light absorbing material. The light shielding structure 150 may be formed by printing, coating, vapor deposition or in other modes. The manufacturing costs can be effectively reduced by manufacturing the light shielding structure by printing.

Figure 3:
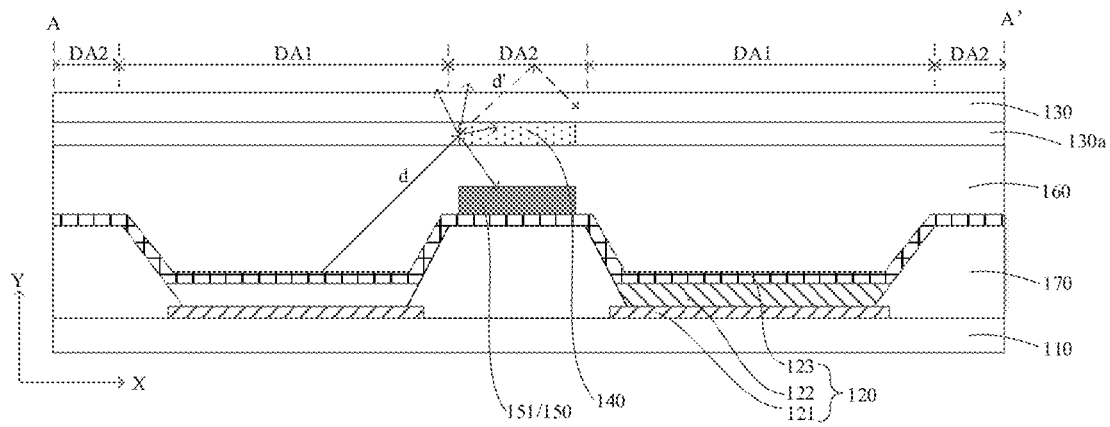
FIG. 3 is another partial cross-sectional view of the display panel along section line AA' of FIG. 1.

In an embodiment of the present disclosure, referring to FIG. 3, FIG. 3 is another partial cross-sectional view of the display panel along section line AA' of the present application. The first function film layer 130 is a cover plate. The scattering structure 140 is located between the light shielding structure 150 and the cover plate 130 in the first direction Y. In this case, the scattering structure 140 may be obtained by distributing scattering particles in an adhesive layer 130a between the cover plate 130 and an adjacent film layer. As described above, when the light of the display function layer 120 is emitted from the cover plate 130 to the outside of the display panel 100, since the refractivity difference between the air and the cover plate 130 of the display panel 100 is larger, the emitted light of the display panel 100, for example, light d', is easily totally reflected, thereby reducing the light emission efficiency of the display panel 100. The scattering structure 140 is disposed on a side of the light shielding structure 150 close to the cover plate. This helps reduce the total reflection of display light emitted to the cover plate 130.

In an embodiment of the present disclosure, still referring to FIG. 3, in the display panel 100 of the present disclosure, the first function layer 130 is a polarizer, the light shielding structure 150 includes a first light shielding sub-structure 151, and the first light shielding sub-structure 151 is located on the side of the scattering structure 140 close to the substrate 110. The polarizer includes multiple film layers. The manufactured polarizer is bonded with other film layers on the display panel 100 by the adhesive layer. In this case, the scattering structure 140 may be obtained by doping scattering particles in the adhesive layer bonding the polarizer.

In one aspect, the scattering structure 140 is located on a side of the polarizer close to the display function layer 120 and disposed in the non-light emitting region DA2 on the light emitting side of the display panel 100. The scattering structure 140 may scatter the light having a large viewing angle and emitted by the light emitting region DA1, and change the light emission angle of the light having a large viewing angle, thereby increasing the light emission efficiency of the light emitting region DA1 and improving the light emission efficiency of the display panel 100.

In another aspect, ambient light enters the display panel 100 through the polarizer 130, and only light having a specific polarization direction can enter the display panel 100 and then pass through a reflection film layer inside the display panel 100, such as an anode or metal of the array layer. After reflection, the polarization direction is changed, and the ambient light cannot be emitted from the interior of the display panel to the outside of the display panel. In this way, the ambient light does not affect the display quality of the display panel. The display panel 100 includes the scattering structure 140. After light are scattered by the scattering structure 140, the original polarization direction of the light is changed, so in a region where the scattering structure 140 is located, the anti-reflection effect of the polarizer 130 is reduced. Thus, a part of the scattered light is emitted outside the display panel 100 through the polarizer 130, and the reflectivity of the display panel 100 to ambient light is increased, thereby affecting the display quality of the display panel 100. In this embodiment of the present disclosure, the first light shielding sub-structure 151 is disposed on a side of the scattering structure 140 close to the display function layer 120, so the light whose polarization direction is changed by the scattering structure 140 is absorbed by the light shielding structure 150, thus is not reflected in the non-light emitting region DA2 and cannot be emitted outside the display panel 100. This improves the problem where the scattering structure 140 reduces the anti-reflection effect of the display panel 100, thereby improving the display quality of the display panel 100.

In one embodiment, still referring to FIG. 3, the first light shielding sub-structure 151 is located between the scattering structure 140 and the display function layer 120 in the first direction Y. It is to be understood that the display function layer 120 includes an anode 121, a light emitting layer 122, a cathode 123. The anode 121 is a film layer having a high reflectivity. The reflectivity of the cathode 123 in the non-light emitting region DA2 is about 50% of the total reflectivity of film layers in the non-light emitting region. Therefore, the first light shielding sub-structure 151 is disposed between the scattering structure 140 and the display function layer 120. In this case, the first light shielding sub-structure 151 is located on a side of the cathode 123 away from the substrate 110, so that the ambient light can be effectively absorbed, and the phenomenon where the ambient light reaches the display functional layer 120 and is thus reflected by the display functional layer 120 is avoided. This reduces the light reflectivity of the display panel 100 and helps to improve the display effect of the display panel 100.

It is to be noted that FIG. 3 illustrates a structure where there are other film layers, for example, an encapsulation layer, between the scattering structure 140 and the light shielding structure 150. In some embodiments of the present disclosure, referring to FIG. 2, FIG. 2 illustrates an embodiment where the scattering structure 140 is in direct contact with the light shielding structure 150. In this embodiment, the scattering structure 140 is closest to the light shielding structure 150 in the first direction Y, and the light shielding structure 150 may directly absorb light that propagates into the display panel 100 after scattered by the scattering structure 140, thereby effectively reducing light reflection in the non-light emitting region DA2 and improving the display quality of the display panel. In an embodiment of the present disclosure, the scattering structure 140 merely overlap with the light shielding structure 150 in the first direction Y, and film layer locations of the scattering structure 140 and the light shielding structure 150 are not limited in the present disclosure.

Figure 4:
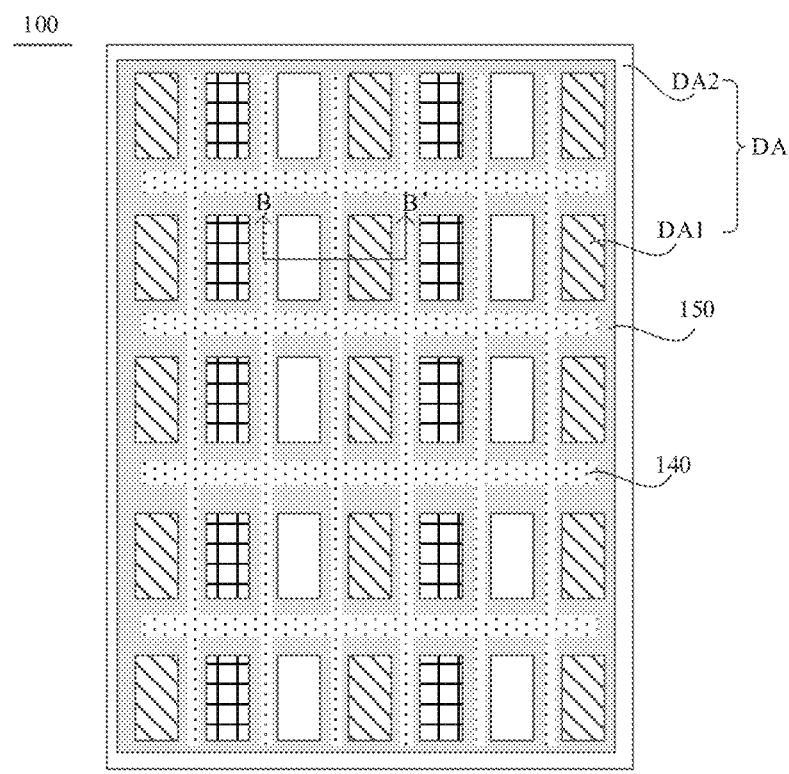
FIG. 4 is another top view of a display panel according to the present disclosure.
Figure 5:
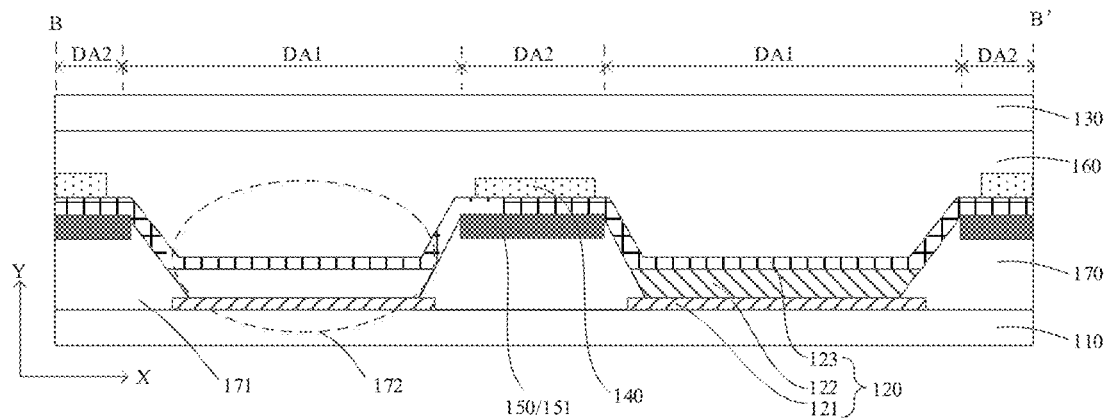
FIG. 5 is a partial cross-sectional view of the display panel along section line BB' of FIG. 4.

In an embodiment of the present disclosure, referring to FIGS. 4 and 5, FIG. 4 is another top view of a display panel according to the present disclosure, and FIG. 5 is a partial cross-sectional view of the display panel along section line BB' of FIG. 4. An orthographic projection of a scattering structure 140 onto the substrate 110 falls into an orthographic projection of a first light shielding sub-structure 151 onto a substrate 110. In the top view of FIG. 4, the orthographic projection of the scattering structure 140 onto the substrate 110 falls entirely within the orthographic projection of the light shielding structure 150. It is to be noted that the scattering structure 140 may be disposed to a continuous meshed structure as shown in FIG. 4, or may a discontinuous structure located between adjacent light emitting regions DA1; and the light shielding structure 150 may be a discontinuous structure in the non-light emitting region DA2, or a continuous structure filling the entire non-light emitting region DA2. The structures shown in FIG. 4 are merely schematic, which are not limited in the present disclosure.

It is to be understood that when the first light shielding sub-structure 151 is disposed on a side of the scattering structure 140 close to a display function layer 120, the width of the scattering structure 140 and the width of the first light shielding sub-structure 151 may not be limited in a direction X parallel to a plane where the substrate 110 is located, as long as the first light shielding sub-structure 151 can absorb light passing through the scattering structure. In an embodiment of the present disclosure, in the direction parallel to the substrate 110, the width of the first light shielding sub-structure 151 may be set to equal to the width of the scattering structure 140, or the width of the first light shielding sub-structure 151 is greater than the width of the scattering structure 140. That is, the orthographic projection of the scattering structure 140 onto the substrate 110 falls into the orthographic projection of the first light shielding sub-structure 151 onto the substrate 110. Thus, the first light shielding sub-structure 151 can better absorb unnecessary light scattered by the scattering structure 140, further reducing the reflectivity of ambient light and improving the display effect.

It is to be noted that, in the present disclosure, the width of a specific structure in a specific direction refers to the size of the structure in the specific direction in a corresponding cross-sectional view. For example, the width of the first light shielding sub-structure 151 in the direction parallel to the substrate 110 refers to the length of the first light shielding sub-structure in the direction X parallel to the plane of the substrate 110 in the cross-sectional view along cross-sectional line AA'. A description of the width relationship between the light shielding structure and the scattering structure in the present disclosure is given below using an example where the light shielding structure and the scattering structure are located in the same non-light emitting region. A comparison is performed on the width of the light shielding structure and the width of the scattering structure in a non-light emitting region between adjacent light emitting regions.

Figure 6:
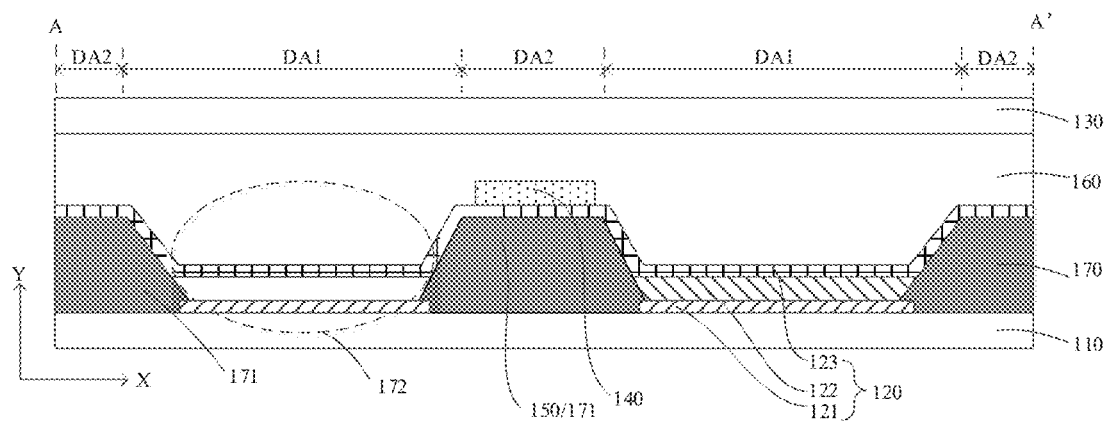
FIG. 6 is another partial cross-sectional view of the display panel along section line AA' of FIG. 1.

In an embodiment of the present disclosure, referring to FIGS. 5 and 6, FIG. 6 is another partial cross-sectional view of the display panel along section line AA' according to the present disclosure. The display panel 100 includes a pixel definition layer 170. The pixel definition layer 170 includes a pixel definition structure 171 and a pixel opening 172. The pixel definition structure 171 is located in the non-light emitting region DA2. The pixel opening 172 is located in the light emitting region DA1. It is to be understood that various light emitting regions DA1 are separated by pixel definition structures 171, and the pixel definition structures 171 are disposed between the various light emitting regions DA1. In an embodiment of the present disclosure, referring to FIG. 5, the light shielding structure 150 is made on a side of the pixel definition structure 171 close to the scattering structure 140. In this case, the light shielding structure 150 may be a separate structure or may be forming by partially doping light absorbing materials in the pixel definition structure 171. In an embodiment of the present disclosure, referring to FIG. 6, the pixel definition structure 171 includes a light shielding material, and specifically, may be made of a light absorbing material. The pixel definition structure 171 is entirely made of a light shielding material. The pixel definition structure 171 also functions as the light shielding structure 150. In the display panel 100, the pixel definition layer 170 defines the light emitting region DA1 and the non-light emitting region DA2 of the display panel. That is, the pixel definition structure 171 of the pixel definition layer 170 corresponds to the non-light emitting region DA2, the pixel opening 172 of the pixel definition layer 170 corresponds to the light emitting region, and the light emitting layer 122 of the display function layer 120 is located in the pixel opening 172 of the pixel definition layer 170. The pixel definition structure 171 is made of the light shielding material. In one aspect, this can avoid light crosstalk between light of different colors between adjacent light emitting regions DA1. In another aspect, the pixel definition structure 171 may be also function as the light shielding structure 150 to absorb light in the non-light emitting region DA2 propagating to the interior of the display panel 100, and thus, the light is prevented from being reflected outside the display panel 100 by the reflective film layer in the non-light emitting region DA2, thereby reducing the light reflectivity of the display panel. Moreover, no additional film layer is required for making the light shielding structure 150, so that the manufacturing process of the display panel is saved and simplified without increasing the original thickness of film layers, thereby facilitating the light and thin design of the display panel.

Figure 7:
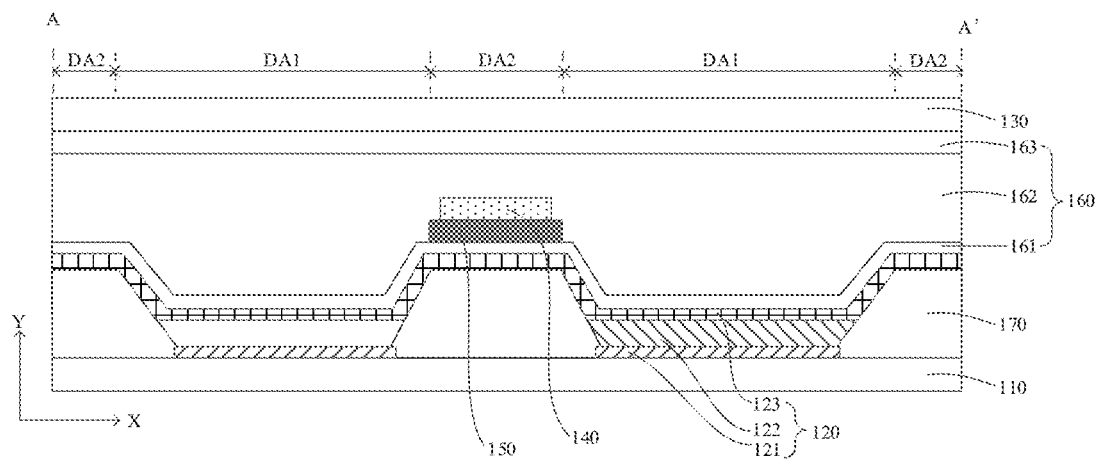
FIG. 7 is another partial cross-sectional view of the display panel along section line AA' of FIG. 1.

In an embodiment of the present disclosure, referring to FIG. 7, FIG. 7 is another partial cross-sectional view of the display panel along section line AA' of FIG. 1. The display panel 100 includes an encapsulation layer 160. The encapsulation layer 160 is located between the first function layer 130 and the display function layer 120 in the first direction Y and includes at least one inorganic encapsulation layer and at least one organic encapsulation layer. The at least one inorganic encapsulation layer includes a first inorganic encapsulation layer 161. The at least one organic encapsulation layer 162 is located on a side of the first inorganic encapsulation layer 161 away from the display function layer 120. The scattering structure 140 is located between the first inorganic encapsulation layer 161 and the at least one organic encapsulation layer 162.

Generally, the refractivity of an organic encapsulation layer ranges from 1.5 to 1.6, and the refractivity of an inorganic encapsulation layer ranges from 1.7 to 1.85. When light of the display function layer is incident from the first inorganic encapsulation layer 161 to the at least one organic encapsulation layer 162, light having a large viewing angle are totally reflected at the interface between the first inorganic encapsulation layer 161 and the at least one organic encapsulation layer 162 due to the refractivity difference, thereby reducing the light emission efficiency of the display panel 100. The scattering structure 140 is located in the encapsulation layer 160 and between the first inorganic encapsulation layer 161 and the at least one organic encapsulation layer 162. In one aspect, this helps to scatter light having a large viewing angle incident from the first inorganic encapsulation layer 161 to the at least one organic encapsulation layer, so that the light to be totally reflected originally is incident on the at least one organic encapsulation layer 162 at a small angle and then emitted to the outside of the display panel. In another aspect, the scattering structure 140 is closer to the display functional layer 120, so that the light having a large viewing angle can be more effectively scattered. Moreover, the scattering structure is inside the at least one organic encapsulation layer 162, avoiding increasing the thickness of film layers of the display panel.

Figure 8:
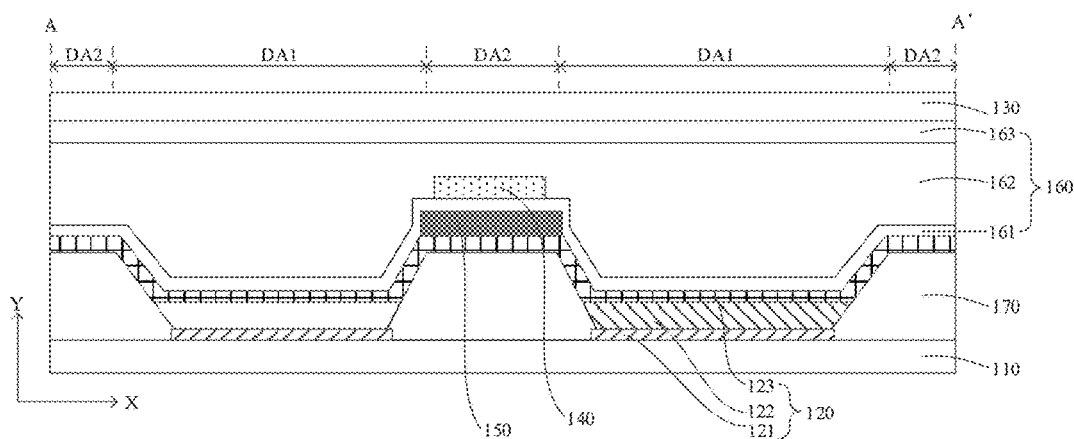
FIG. 8 is another partial cross-sectional view of the display panel along section line AA' of FIG. 1.

In an embodiment of the present disclosure, referring to FIG. 8, FIG. 8 is another partial cross-sectional view of the display panel along section line AA' according to the present disclosure. In the non-light emitting region DA2, the light shielding structure 150 overlaps with the scattering structure 140. In an embodiment of the present disclosure, the light shielding structure 150 is located on the side of the scattering structure 140 close to the substrate 110, and the light shielding structure 150 is located between the display function layer 120 and the encapsulation layer 160.

It is to be noted that the encapsulation layer 160 may be a structure in which inorganic film layers and organic film layers are alternately stacked to prevent the display function layer 120 from being eroded by moisture and oxygen. For ease of a clear description of the solution, the drawings provided by the present disclosure merely illustrates that the encapsulation layer 160 is a structure in which a first inorganic encapsulation layer 161, an organic encapsulation layer 162 and a second inorganic encapsulation layer 163 stacked in sequence. In other embodiments, there may be multiple organic encapsulation layers, or the encapsulation layer 160 may merely include the first inorganic encapsulation layer 161 and the organic encapsulation layer 162.

Figure 9:
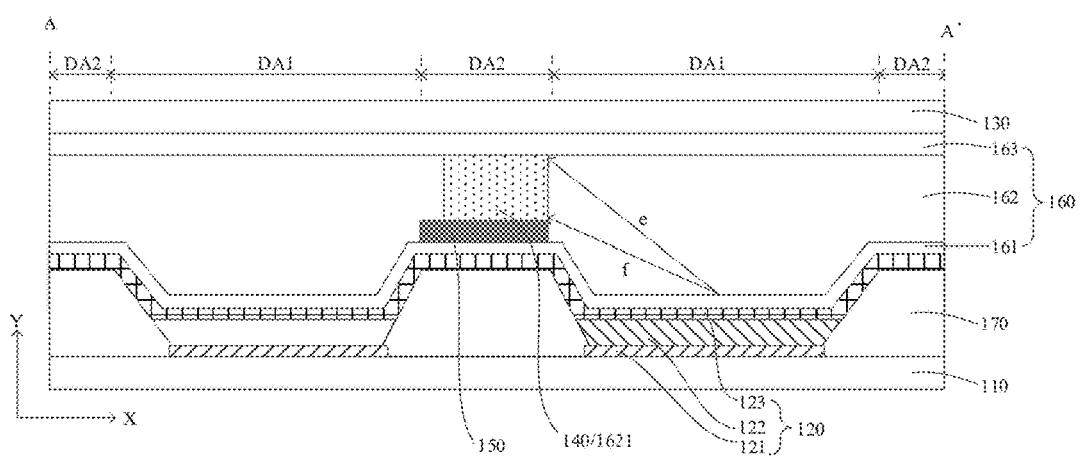
FIG. 9 is another partial cross-sectional view of the display panel along section line AA' of FIG. 1.

In an embodiment of the present disclosure, referring to FIG. 9, FIG. 9 is another partial cross-sectional view of the display panel along section line AA' according to the present disclosure. The display panel 100 includes an encapsulation layer 160. The encapsulation layer 160 is located between the first function layer 130 and the display function layer 120 in the first direction Y and includes at least one inorganic encapsulation layer and at least one organic encapsulation layer 162. The at least one inorganic encapsulation layer includes a first inorganic encapsulation layer 161. The at least one organic encapsulation layer 162 is located on a side of the first inorganic encapsulation layer 161 away from the display function layer 120. The at least one organic encapsulation layer 162 includes a first part 1621. The first part 1621 is located in the non-light emitting region DA2. The first part 1621 includes scattering particles and also functions as the scattering structure 140. The at least one organic encapsulation layer 162 is made of an organic material. Scattering particles may be directly distributed in the at least one organic encapsulation layer 162 to obtain the scattering structure 140, thus saving process while scattering light. The scattering structure 140 is disposed in the at least one organic encapsulation lay 162. In this case, the scattering structure 140 is closer to the emitting region DA1, and most of light having a large viewing angle may be adjusted by using a scattering structure 140 with a smaller thickness. Since light having a large viewing angle emitted from the light emitting region DA1 may be regarded as light emitted outward from a point light source, the farther away from the point light source, the more divergent propagation directions of light, and thus, referring to light e and f in FIG. 9, a larger thickness of the scattering structure 140 is required to adjust most of the light having a large viewing angle. Since the at least one organic encapsulation layer 162 has a flattening function and has a larger thickness in the display panel, the at least one organic encapsulation layer 162 also functions as the scattering structure 140 by distributing scattering particles in the at least one organic encapsulation layer 162, and thus, the thickness of the scattering structure 140 is set more flexibly without increasing the thickness of the display panel, thereby facilitating the light and thin design of the display panel 100.

It is to be noted that the scattering structure 140 may be formed by doping scattering particles in an organic encapsulation layer in a part of thickness and width in the non-light emitting region, or doping scattering particles in an organic encapsulation layer entirely in the non-light emitting region, which is not limited in the present disclosure.

In an embodiment of the present disclosure, the density of scattering particles in the scattering structure 140 gradually increases in the direction from the display function layer 120 to the scattering structure 140. The scattering structure 140 is disposed in the non-light emitting region DA2 of the display panel 100 and may scatter light having a large viewing angle emitted by the light emitting region DA1. The farther a part of the scattering structure 140 is away from the display function layer 120 in the first direction Y, the more light having a large viewing angle is incident on the part. The larger density of scattering particles better facilitates the light divergence. Thus, the density of scattering particles in the scattering structure 140 gradually increases, and this helps the scattering structure to scatter light having a large viewing angle, so that more light having a large viewing angle changes the emission direction, thereby helping to improve the light emission efficiency of the display panel.

In an embodiment of the present disclosure, the particle size of scattering particles in the scattering structure 140 gradually decreases in the direction from the display function layer 120 to the scattering structure 140. The smaller particle size of scattering particles better helps to scatter light. Thus, the particle size of scattering particles gradually decreases in a part of the scattering structure 140 away from the display function layer 120, and this better helps to scatter light having a large viewing angle in the light emitting region DA1, thereby helping to improve the light emission efficiency of the display panel.

Figure 10:
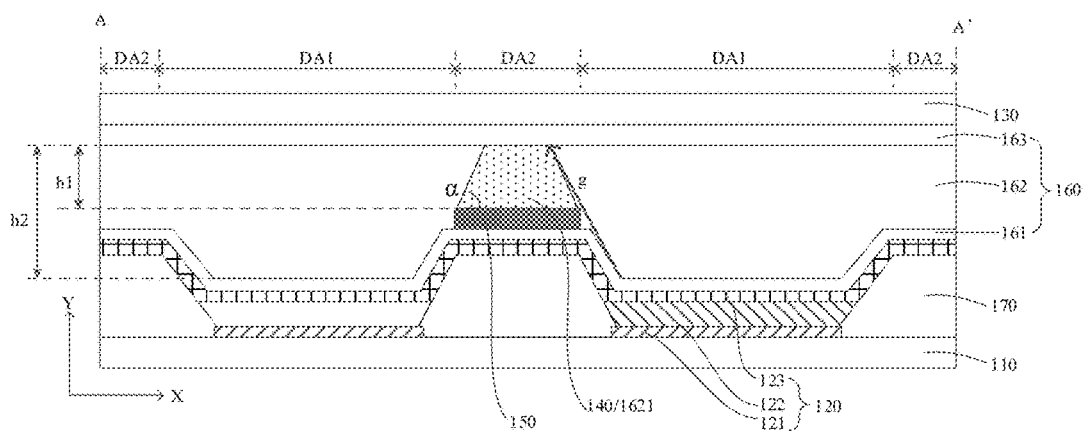
FIG. 10 is another partial cross-sectional view of the display panel along section line AA' of FIG. 1.

In an embodiment of the present disclosure, referring to FIG. 10, FIG. 10 is another partial cross-sectional view of the display panel along section line AA' according to the present disclosure. The thickness h1 of a first part 1621 of an organic encapsulation layer 162 in the first direction Y is less than the maximum thickness h2 of the organic encapsulation layer 162 in the first direction Y. Generally, a second inorganic encapsulation layer 163 is further manufactured on a side of the organic encapsulation layer 162 away from the substrate 110, or a touch function layer, a color film layer and other film layers are manufactured on a side of an encapsulation layer 160 away from the substrate 110. The first part 1621 of the organic encapsulation layer 162 is located in the non-light emitting region DA2 of the display panel 110, that is, located above a pixel definition structure 171, and the thickness h1 of the first part 1621 in the first direction Y is set to less than the thickness of other parts of the organic encapsulation layer 162 in the first direction Y. This helps to balance the film thickness difference between the non-light emitting region DA2 and the light emitting region DA1, that is, between the pixel definition structure 171 and a pixel opening 172, thereby ensuring the flatness of film layers manufactured above the organic encapsulation layer 162.

Figure 11:
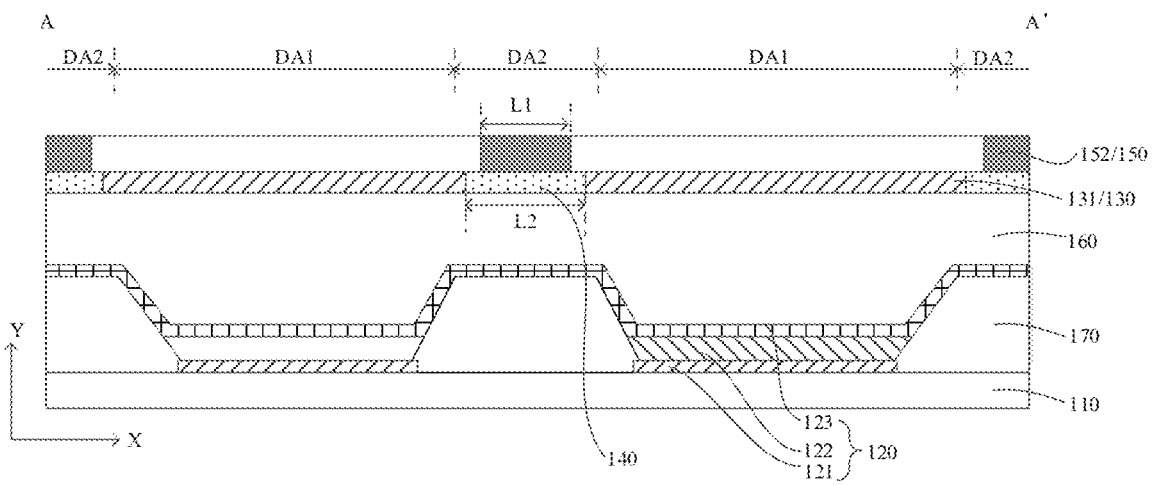
FIG. 11 is another partial cross-sectional view of the display panel along section line AA' of FIG. 1.

In an embodiment of the present disclosure, referring to FIG. 11, FIG. 11 is another partial cross-sectional view of the display panel along section line AA' according to the present disclosure. The first functional layer 130 of the display panel 100 is a color film layer. The color film layer includes a color resist 131. An orthographic projection of the color resist 131 onto the substrate 110 covers at least the light emitting region DA1. The light shielding structure 150 includes a second light shielding sub-structure 152. The second light shielding sub-structure 152 is located on a side of the scattering structure 140 facing away from the display function layer 120. A basic structure of a polarizer includes polyvinyl alcohol (PVA) in the middle, two layers of cellulose triacetate (TAC), a pressure sensitive adhesive (PSA) film, a release film and a protective film. Since the polarizer includes multiple film layers, the thickness of the display panel 100 is increased. Moreover, in the display panel 100 including the polarizer, only a part of light of the display function layer 120 can be emitted outside the display panel 100, thereby leading to the light emission loss of the display panel 100 and reducing the light emission efficiency of the display panel 100. In an embodiment of the present disclosure, the design of the polarizer of the display panel 100 may be eliminated, and the color film layer 130 may be used instead of the polarizer. Color resist structures 131 of corresponding colors are disposed above various light emitting regions DA1 in one-to-one correspondence. For example, a red resist, a green resist and a blue resist cover a red sub-pixel, a green sub-pixel and a blue sub-pixel, respectively. The light shielding structure is disposed between adjacent sub-pixels. This can not only avoid light reflection but also improve the light emission efficiency. Moreover, the thickness of the color film layer is much less than the thickness of the polarizer, helping to reduce the thickness of the display panel. In this embodiment of the present disclosure, the second light shielding sub-structure 152 is disposed in the non-light emitting region DA2 and located on the side of the scattering structure 140 facing away from the display function layer 120. In one aspect, this can avoid the light crosstalk between adjacent color resists 131. In another aspect, the second light shielding sub-structure 152 can absorb light reflected from the non-light emitting region DA2. This can reduce the light reflectivity of the display panel and improve the display effect.

In an embodiment of the present disclosure, still referring to FIG. 11, an orthographic projection of the second shielding sub-structure 152 onto the substrate 110 falls into the orthographic projection of the scattering structure 140 onto the substrate 110. The minimum width L2 of the scattering structure 140 is greater than the width L1 of the second shielding sub-structure 152 in a second direction X. The second direction X is parallel to the plane where the substrate 110 is located. The second light shielding sub-structure 152 is located on the side of the scattering structure 140 facing away from the display function layer 120. If the width of the second light shielding sub-structure 152 is set to greater than the width of the scattering structure 140, the second light shielding sub-structure 152 covers the light emitting region of the display panel and shields light having a large viewing angle emitted from a sub-pixel, thereby reducing the light emission efficiency of the display panel. Moreover, when the width of the second light shielding sub-structure 152 is greater than the width of the scattering structure 140, most of scattered light is shielded and absorbed by the second light shielding sub-structure 152, and this does not help to emit the scattered light. The width of the second light shielding sub-structure 152 is less than the width of the scattering structure, thereby avoiding light reflection of the display panel without affecting normal light emission of the display panel. In an embodiment of the present disclosure, the scattering structure 140 may be disposed in the same layer as the color resist 131. It is be noted that in some embodiments of the present disclosure, when the first function layer 130 is the color film layer, the second light shielding sub-structure 152 may be located on a side of the color film layer 130 facing away from the display function layer 120, or on a side of the color film layer 130 close to the display function layer 120, which is not limited in the present disclosure.

Figure 12:
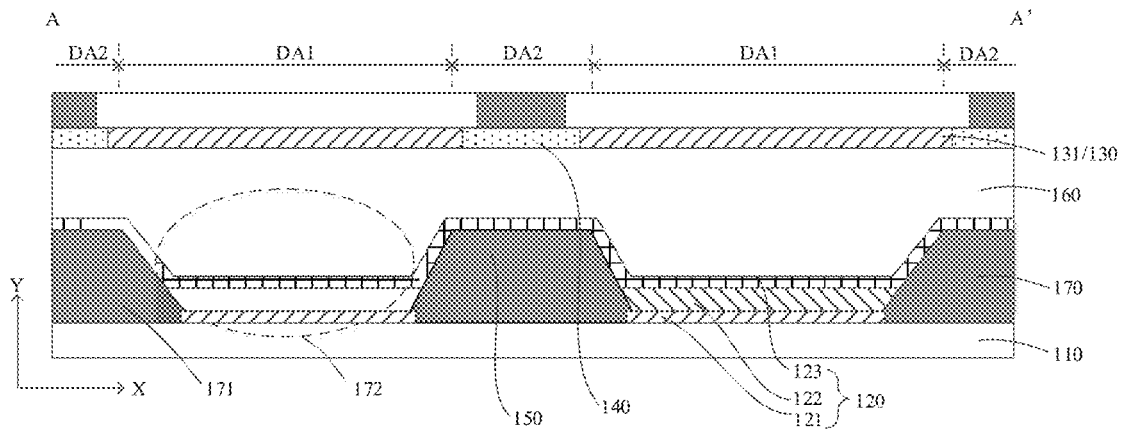
FIG. 12 is another partial cross-sectional view of the display panel along section line AA' of FIG. 1.

In an embodiment of the present disclosure, referring to FIG. 12, FIG. 12 is another partial cross-sectional view of the display panel along section line AA' according to the present disclosure. The light shielding structure 150 includes a first light shielding sub-structure 151. The first light shielding sub-structure 151 is located on a side of the scattering structure 140 away from a second light shielding sub-structure 152. An orthographic projection of the scattering structure 140 onto the substrate 110 falls into an orthographic projection of the first light shielding sub-structure 151 onto the substrate 110. The second light shielding sub-structure 152 is located on a side of the scattering structure 140 away from the display function layer 120, reducing the emission of reflected light of the display panel 100. The first sub-light shielding structure 151 is located on the side of the scattering structure 140 away from the second light shielding sub-structure 152, and thus, light scattered from the scattering structure 140 to the display function layer 120 are absorbed and shielded, further reducing the light reflection of the display panel. In an embodiment of the present disclosure, the first light shielding sub-structure 151 covers the orthographic projection of the scattering structure 140 onto the substrate. In the non-light emitting region DA2, the light scattered from the scattering structure 140 to the display function layer 120 is absorbed to the greatest extent by the first light shielding sub-structure 151, further reducing the light reflectivity of the display panel and improving the display effect of the display panel. In some embodiments of the present disclosure, the display panel 100 includes a pixel definition layer 170. The pixel definition layer 170 includes a pixel definition structure 171 and a pixel opening 172. The pixel definition structure 170 defines the light emitting region DA1 and the non-light emitting region DA2. The pixel definition structure 170 corresponds to the non-light emitting region DA2. The pixel opening 171 corresponds to the light emitting region DA1. The pixel definition structure 171 is made of a light absorbing material and also functions as the first light shielding sub-structure 151.

Figure 13:
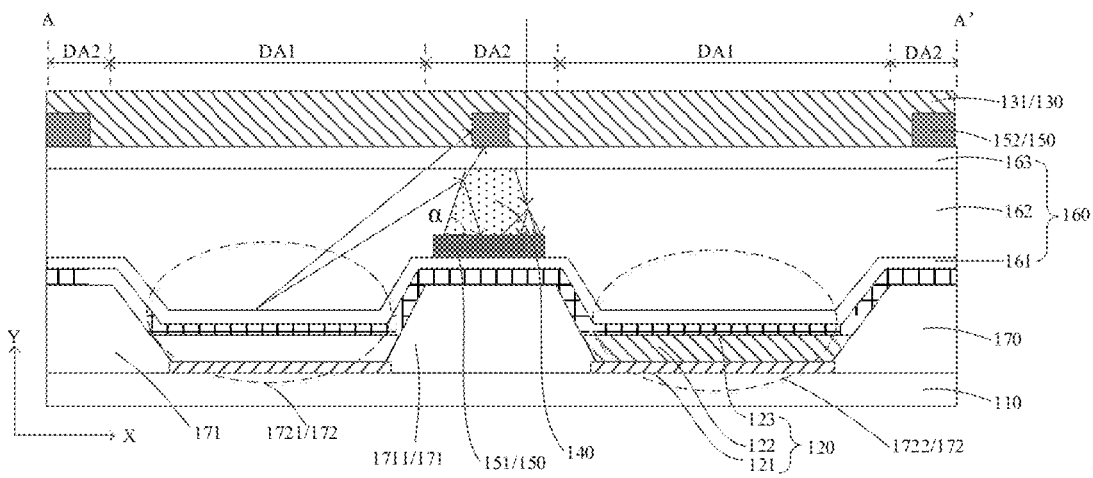
FIG. 13 is a partial cross-sectional view along a first cross-section of a display panel according to the present disclosure.
Figure 14:
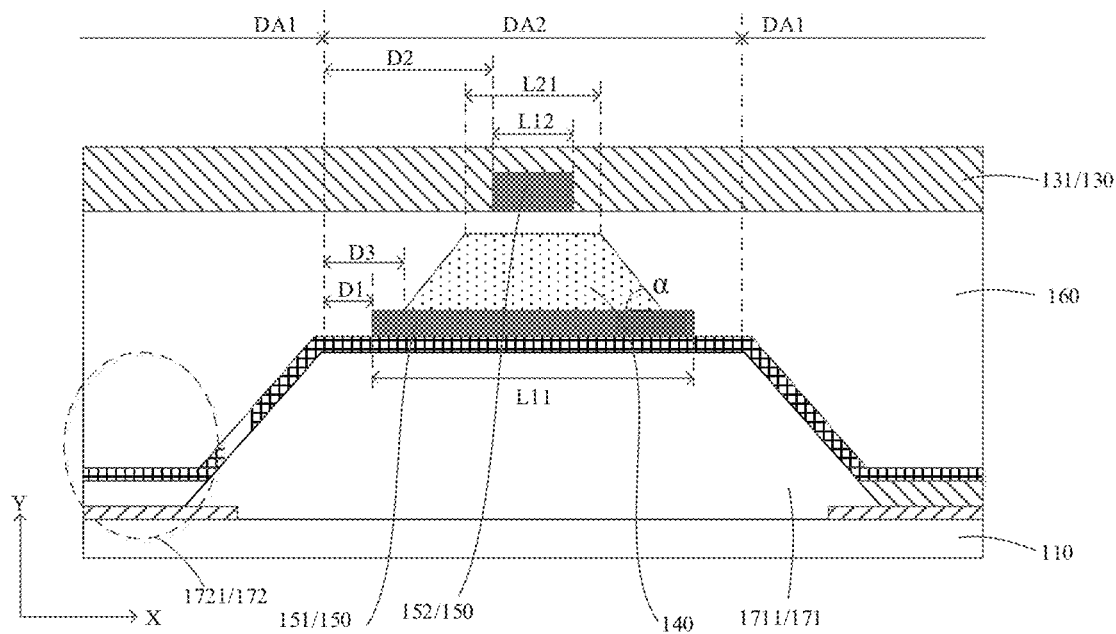
FIG. 14 is a partially enlarged across-sectional view of a display panel according to the present disclosure.

In an embodiment of the present disclosure, referring to FIGS. 13 and 14, FIG. 13 is a partial cross-sectional view along a first cross-section of a display panel according to the present disclosure, and FIG. 14 is a partially enlarged across-sectional view of a display panel according to the present disclosure. For ease of a clearer description of the solution, an encapsulation layer 160 in the structure of FIG. 14 is simplified and only shown as a one-layer structure. In an embodiment, the encapsulation layer may be a multi-layer structure in which inorganic layers and organic layer are alternately stacked.

The display panel 100 includes a pixel definition layer 170. The pixel definition layer 170 includes a pixel definition structure 171 and a pixel opening 172. The pixel definition structure 172 is located in a non-light emitting region DA2. The pixel opening 172 is located in a light emitting region DA1. The pixel definition structure 171 includes a first pixel definition structure 1711. The pixel opening 172 includes a first pixel opening 1721. The first pixel definition structure 1711 is adjacent to the first pixel opening 1721. Each of a first light shielding sub-structure 151, a second light shielding sub-structure 152 and a scattering structure 140 overlaps with the first pixel definition structure 1711. The first cross section is perpendicular to a plane where the substrate is located and parallel to a direction from the first pixel definition structure 1711 to the first pixel opening 1721. In the first cross section of the display panel 110, the minimum distance from the first light shielding sub-structure 151 to the first pixel opening 1721 is D1, the minimum distance from the second light shielding sub-structure 152 to the first pixel opening 1721 is D2, and the minimum distance from the scattering structure 140 to the first pixel opening 1721 is D3. D1<D3<D2. The smaller distance from the scattering structure 140 to the first pixel opening 1721 better helps the scattering structure 140 to scatter light having a large viewing angle from the first sub-pixel opening 1721. The distance from the first light shielding sub-structure 151 to the first pixel opening 1721 is less than the distance from the scattering structure 140 to the first pixel opening 1721. In this manner, the light scattered by the scattering structure 140 to a side of the display function layer 120 is shielded more effectively, thereby reducing the light reflectivity in the non-opening region DA2 of the display panel 100. The distance from the second light shielding sub-structure 152 to the first pixel opening 1721 is greater than the distance from the scattering structure 140 to the first pixel opening 1721. In this manner, the cross color and reflection of scattered light are reduced, thereby improving the display effect of the display panel without affecting the normal light emission of the first pixel opening 1721.

In an embodiment of the present disclosure, the difference between the minimum distance from the second light shielding sub-structure 152 to the first pixel opening 1721 and the minimum distance from the first light shielding sub-structure 151 to the first pixel opening 1721, that is, D2−D1=d×tan (arcsin(sin θ/N1)), where d denotes the thickness of the encapsulation layer, N1 denotes the refractivity of the encapsulation layer, and θ denotes an emission angle of light on the display panel. It is to be understood that when the encapsulation layer is a three-layer structure of an inorganic layer, an organic layer and an inorganic layer, D2−D1=d1×tan(arcsin(sin θ/N11))+d2×tan(arcsin(sin θ/N12))+d3×tan (arcsin(sin θ/N13)), where d1, d2 and d3 denote thicknesses of the encapsulation layers respectively, and N11, N12 and N13 denote the reactiveness of the encapsulation layers respectively.

In an embodiment of the present disclosure, still referring to FIG. 14, in a second direction X, the width of the first light shielding sub-structure 151 is L11, the width of the second light shielding sub-structure 152 is L12, and the minimum width of the scattering structure 140 is L21. L11−L21<L21−L12. The larger the first light shielding sub-structure 151, the lower the reflectivity of the display panel 100, and the width of the first light shielding sub-structure 151 is greater than the width of the scattering structure 140 to reduce the reflectivity. The larger the width of the scattering structure 140, the higher the light emission efficiency of the display panel. The smaller the width of the second light shielding sub-structure 152, the smaller the effect on the light emission of the first pixel opening 1721. The width difference between the first light shielding sub-structure 151 and the scattering structure 140 is less than the width difference between the scattering structure 140 and the second light shielding sub-structure 152, and in this manner, the light emission and light reflectivity of the display panel are taken into consideration comprehensively, thus better helping to improve the display performance of the display panel.

Figure 15:
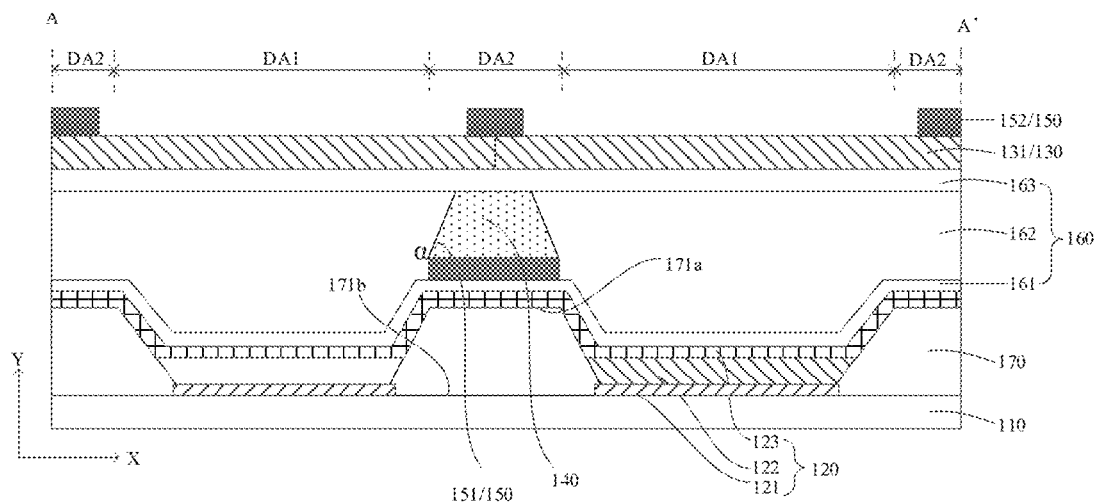
FIG. 15 is another partial cross-sectional view of the display panel along section line AA' of FIG. 1.

In an embodiment of the present disclosure, referring to FIG. 15, FIG. 15 is another partial cross-sectional view of the display panel along section line AA' according to the present disclosure. A pixel definition structure 171 includes a first surface 171a and a second surface 171b arranged in the first direction Y. The first surface 171a is located on a side of the second surface 171b away from the substrate 110. The width of the first surface 171a is equal to the width of a first light shielding sub-structure 151 in a second direction X. The second direction X is parallel to the plane where the substrate is located. The first light shielding sub-structure 151 completely covers the first surface 171a of the pixel definition structure 171, so that the first light shielding sub-structure 151 can cover the cathode outside the light emitting region DA1, effectively reducing the reflectivity problem caused by the cathode, and improving the display quality of the display panel.

In an embodiment of the present disclosure, still referring to FIGS. 10 and 13 to 15, an included angle between a side surface 140a of the scattering structure 140 close to the light emitting region DA1 and a bottom surface 140b of the scattering structure 140 is an acute angle α. The configuration where the included angle between the side surface of the scattering structure 140 and the bottom surface of the scattering structure 140 is an acute angle reduces the effect of the scattering structure on normal light emission of the pixel opening. In an embodiment of the present disclosure, referring to light g of FIG. 10, light g is light having a large viewing angle at the most edge of the light emitting region DA1. The included angle between the side surface 140a and the bottom surface 140b of the scattering structure is set to an acute angle. This does not affect light emission at a front viewing angle at the most edge of the light emitting region, and implements the scattering of the light having a large viewing angle at the most edge. It is to be noted that the scattering structure 140 set to trapezoid in the drawings is only an example. In other embodiments, the scattering structure 140 may further be a triangle or other shapes, which is not limited in the present disclosure.

In an embodiment of the present disclosure, the refractivity of a film layer where the scattering structure 140 is located is n1, and light emitted from the pixel opening includes first light. The first light is emitted outside the display panel at an emission angle β. The emission angle is an included angle between the first light and the normal of the display panel.

$$\beta \geq 60°. \ \alpha = \frac{\pi}{2} - \arcsin\left(\frac{\sin\beta}{n1}\right).$$

The bottom angle of the scattering structure is acute angle α, and only light having an emission angle greater than β is scattered. It is to be understood that the light having an emission angle β greater than 60° is more likely to be totally reflected between various film layers of the display panel, so that the totally reflected light having a large viewing angle is scattered by the scattering structure, thereby improving the light emission efficiency of the display panel.

Touch display is a necessary requirement for high-end electronic products in the market. A touch screen is embedded. A drive electrode line and a detection electrode line for implementing a touch function are disposed on a substrate of a display screen. Compared with a traditional external touch display device, a touch display device using embedded touch screen technology has the advantages of thinner thickness, higher performance, lower costs and the like. Thus, the embedded touch display technology has gradually become a new favorite in research and development.

Figure 16:
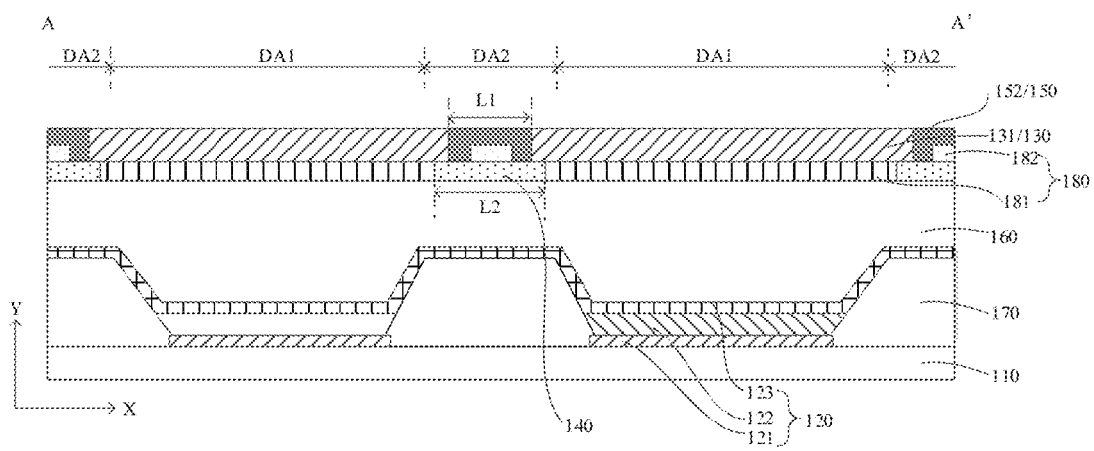
FIG. 16 is another partial cross-sectional view of the display panel along section line AA' of FIG. 1.

In an embodiment of the present disclosure, referring to FIG. 16, FIG. 16 is another partial cross-sectional view of the display panel along section line AA' according to the present disclosure. The display panel 100 of the present disclosure includes a touch function layer 180. The touch function layer 180 is located on a side of the display function layer 120 away from the substrate 110. The touch function layer 180 includes a touch medium layer 181. The scattering structure 140 is disposed in the same layer as the touch medium layer 181. The touch function layer 180 generally includes a touch metal layer and the touch medium layer 181. The metal layer includes a patterned touch electrode 182. The medium layer may be an inorganic insulating layer or an organic insulating layer between touch electrodes, or an adhesive layer inside the touch function layer. The scattering structure is disposed in the same layer as the touch medium layer, facilitating the light and thin design of the display panel.

It is to be noted that, in the solution where the scattering structure 140 is disposed in the display panel 100, the present disclosure merely illustrates that the scattering structure 140 is disposed in the same layer as the adhesive layer between film layers, the organic encapsulation layer, the color resist of the color film or the touch medium layer. In some embodiments of the present disclosure, the scattering structure 140 may further be disposed in the same layer as a planarization layer of the display panel, or as an organic film layer located on the side of the display function layer 120 away from the substrate 110.

In an embodiment of the present disclosure, the light shielding structure 150 includes a second light shielding sub-structure 152. The second light shielding sub-structure 152 is located on a side of the scattering structure 140 facing away from the display function layer 120. The touch function layer 180 includes the touch electrode 182. The touch electrode 182 is located on a side of the second light shielding sub-structure 152 close to the display function layer 120. The second light shielding sub-structure 152 covers the touch electrode 182 in the first direction Y. The touch electrode 182 is located on a side of the second light shielding structure close to the display function layer and can reflect light scattered by the scattering structure, thus improving the light emission efficiency of the display panel. Moreover, the second light shielding structure 152 covers the touch electrode and has a better light shielding effect, so that a pattern of the touch electrode can be shielded and eliminated on the screen, thereby improving the display quality of the display panel. In an embodiment of the present disclosure, still referring to FIG. 16, the touch electrode may be located inside a color film layer. In one aspect, the manufacturing process of the touch structure is integrated into the manufacturing process of the color film layer, so that the display panel has a thinner thickness and a better optical transparency. In another aspect, at least one of the second light shielding sub-structure and the color resist of the color film layer is located on a side of the touch electrode layer away from the display function layer, ensuring a higher touch sensitivity.

In an embodiment of the present disclosure, the touch electrode 182 is located between the second sub-light shielding structure 152 and the scattering structure 140 in the first direction Y. The touch electrode partially reflects the light scattered from the scattering structure and reduces the light reflectivity of the display panel, by combining with the second light shielding structure.

Figure 17:
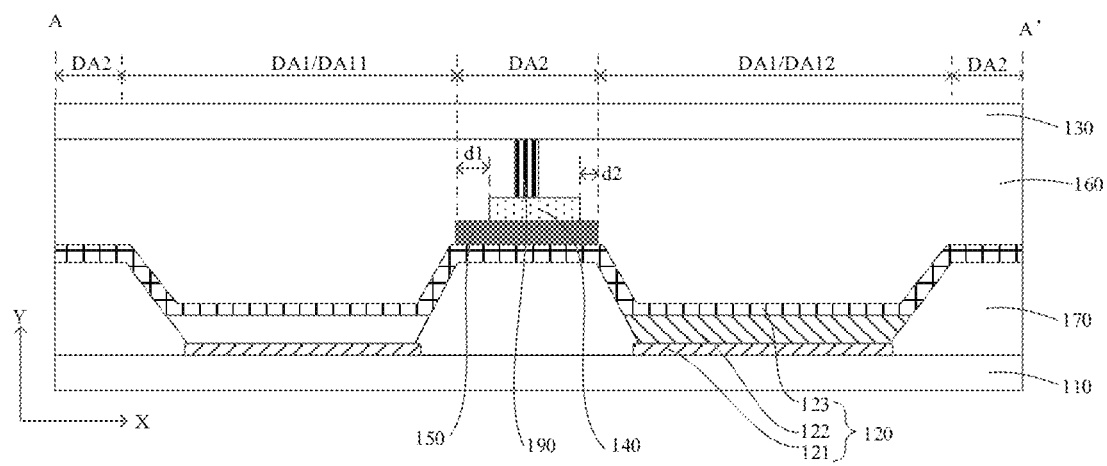
FIG. 17 is another partial cross-sectional view of the display panel along section line AA' of FIG. 1.
Figure 18:
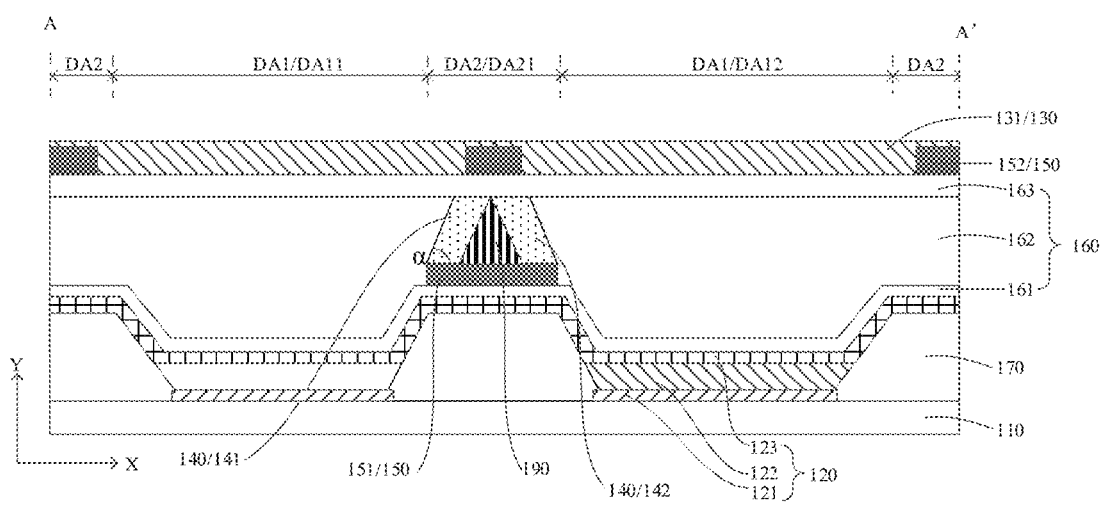
FIG. 18 is another partial cross-sectional view of the display panel along section line AA' of FIG. 1.
Figure 19:
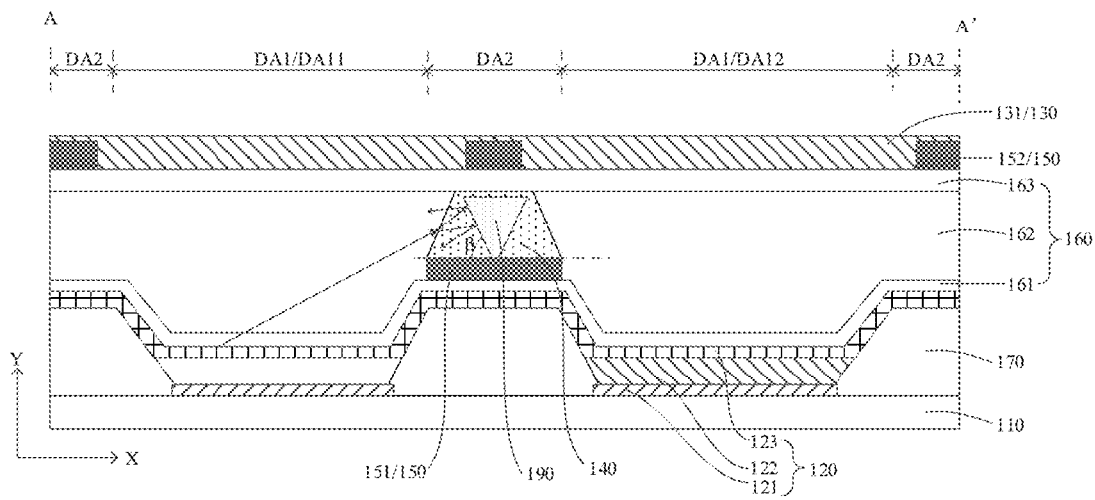
FIG. 19 is another partial cross-sectional view of the display panel along section line AA' of FIG. 1.
Figure 20:
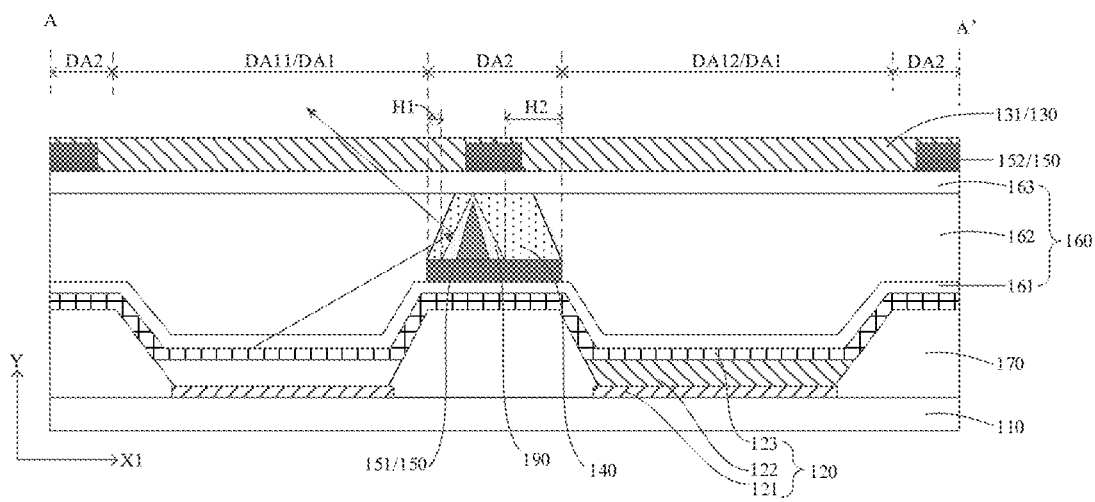
FIG. 20 is another partial cross-sectional view of the display panel along section line AA' of FIG. 1.

In an embodiment of the present disclosure, referring to FIGS. 17-20, FIG. 17 is another partial cross-sectional view of the display panel along section line AA' according to the present disclosure, FIG. 18 is another partial cross-sectional view of the display panel along section line AA' according to the present disclosure, FIG. 19 is another partial cross-sectional view of the display panel along section line AA' according to the present disclosure, and FIG. 20 is another partial cross-sectional view of the display panel along section line AA' according to the present disclosure. The display panel 100 includes a blocking structure 190. The blocking structure 190 is located in the non-light emitting region DA2. The blocking structure 190 is located on a side of the display function layer 120 away from the substrate 110. The light transmittance of the blocking structure is T. T<1%. The blocking structure 190 is located in the non-light emitting region, that is, between adjacent light emitting regions, and the light transmittance of the blocking structure 190 is less than 1%, thereby avoiding the color cross problem between adjacent light emitting regions. It is to be noted that the first function film layer may be a polarizer or a color film layer, which is not limited here.

In an embodiment of the present disclosure, referring to FIG. 18, the first function layer 130 is a color film layer. The color film layer includes a color resist 131. An orthographic projection of the color resist 131 onto the substrate 110 covers at least the light emitting region DA1. A blocking structure 190 is located between the color film layer 130 and the display function layer 120. Light is emitted by the display function layer 120 and enter a corresponding color resist. However, a part of light having a large viewing angle enters adjacent color resists. If two adjacent color resists have different colors, a cross color problem is caused. Therefore, in an embodiment of the present disclosure, the blocking structure having a low light transmittance is disposed between the color film layer and the display function layer to avoid the cross-color problem between adjacent light emitting regions.

In an embodiment of the present disclosure, still referring to FIG. 18, the light shielding structure 150 includes a second light shielding sub-structure 152. The second light shielding sub-structure 152 is located on the side of the scattering structure 140 facing away from the display function layer 120. The second light shielding sub-structure 152 overlaps with the blocking structure 190. The second light shielding sub-structure 152 disposed on the side of the scattering structure facing away from the display function layer also avoids cross color between adjacent light emitting regions. The second light shielding sub-structure overlaps with the blocking structure, so that the area occupied by the non-light emitting region in the display panel is reduced, thereby helping to improve the area of the light emitting region of the display panel.

It is to be noted that the light transmittance of the blocking structure 190 is smaller. The blocking structure 190 may be a light absorbing material and absorbs light incident on the blocking structure. The light absorbing material may be the same as the material of the light shielding structure, including black resin and the like. In some embodiments of the present disclosure, the blocking structure 190 may further include a highly reflective material, for example, metal, to reflect light having other angles.

In an embodiment of the present disclosure, referring to FIGS. 19 and 20, a blocking structure 190 includes a reflective material. A side of the blocking structure 190 close to the light emitting region DA1 is a reflective surface. An included angle β between the reflective surface and the plane where the substrate 110 is located is an acute angle. It is to be understood that light hitting the reflective surface is reflected, and the configuration where the included angle between the reflective surface and the plane where the substrate 110 is located is an acute angle includes two cases. Referring to FIG. 19, the reflective surface is inclined toward a first light emitting sub-region DA11, and an included angle between the reflective surface and the plane where the substrate 110 is located is less than 90°. In this case, light having a large viewing angle and hitting the reflective surface is reflected back to the light emitting region by the reflective surface, thus avoiding the crosstalk of light having a large viewing angle. In another embodiment, the reflective surface is inclined facing away from the DA11. In this case, the included angle between the reflective surface and the plane where the substrate 110 is located is less than 90°. After reflected by the reflective surface, the light having a large viewing angle of the display function layer 120 is emitted outside the display panel, thus improving the light emission efficiency of the display panel.

In an embodiment of the present disclosure, still referring to FIG. 20, an included angle between a reflective surface and a bottom surface of the blocking structure 190 is an acute angle. Light having a large viewing angle of the light emitting layer is incident on the reflective surface of the light shielding structure. Since the included angle between the reflective surface and the bottom surface of the shielding structure 190 is an acute angle, light is reflected and then emitted outside the display panel, thus improving the light emission efficiency of the display panel.

It is to be noted that the blocking structure 190 includes a reflective material. The blocking structure is entirely made of the reflective material, or the blocking structure may be made by coating the surface of other materials with a reflective material, which is not limited in the present application, as long as the blocking structure has a low light transmittance and includes the reflective surface.

In an embodiment of the present disclosure, referring to FIG. 20, the light emitting region DA1 includes a first light emitting region DA11 and a second light emitting region DA12 adjacent to each other. The wavelength of light emitted from the first light emitting region DA11 is greater than the wavelength of light emitted from the second light emitting region DA12. The blocking structure 190 is located between the first light emitting region DA11 and the second light emitting region DA12. In a direction X1 from the first light emitting sub-region DA11 to the second light emitting sub-region DA12, the minimum distance H1 from the blocking structure 190 to the first light emitting region DA11 is less than the minimum distance H2 from the blocking structure 190 to the second light emitting region DA12. At a large viewing angle, the longer the wavelength is, the greater light attenuation is, so the display panel is prone to color cast problem caused by different light-attenuation extent of different colors. In view of this, in an embodiment of the present disclosure, the blocking structure having the reflective surface is disposed closer to the light emitting region DA11 having a larger wavelength, so that for the light having a larger wavelength, more light having a large viewing angle is emitted outside the display panel. This balances the light attenuation problem at a large viewing angle and reduces the color cast of the display panel at the large viewing angle, thereby improving the display quality of the display panel.

It is to be noted that the blocking structure 190 may be located inside the scattering structure. Referring to FIG. 19, the blocking structure 190 is firstly manufactured, the blocking structure is coated with an organic layer, and scattering particles are doped to form the scattering structure 140. The scattering structure completely covers the blocking structure and is located around and above the blocking structure 190. In an embodiment of the present disclosure, the scattering structure 140 and the blocking structure 190 are separately formed in the non-light emitting region DA2. Referring to FIG. 18, specifically, the light emitting region DA1 includes a first light emitting region DA11 and a second light emitting region DA12. In a first non-light emitting region DA21 located between the first light emitting region DA11 and the second light emitting region DA12, the scattering structure 140 includes a first scattering sub-structure 141 and a second scattering sub-structure 142. The blocking structure 190 is located between the first scattering sub-structure 141 and the second scattering sub-structure 142 in the direction from the first light emitting region DA11 to the second light emitting region DA12. The blocking structure 190 and the scattering structure 140 may further have other location relationships, which are not more defined in the present disclosure.

In an embodiment of the present disclosure, the minimum distance from the scattering structure 140 to the substrate 110 is the same as the minimum distance from the blocking structure 190 to the substrate 110, and the height of the scattering structure 140 in the first direction Y is less than or equal to the height of the blocking structure 190 in the first direction Y. The scattering structure 140 and the blocking structure 190 are disposed at the same height on the side of the display function layer facing away from the substrate. In one aspect, the blocking structure can more effectively absorb light having a large viewing scattered by the scattering structure. In another aspect, the blocking structure and the scattering structure can be manufactured in the same manufacturing process and then formed by doping different materials (scattering particles and a light absorbing material), thus saving the manufacturing process. In an embodiment of the present disclosure, the height of the scattering structure is less than or equal to the height of the blocking structure in the first direction Y. The blocking structure can better avoid cross color. When the scattering structure and the blocking structure have a same height, the flatness of the film layer can be ensured, thus helping to manufacture a thick film layer. When the blocking structure has a larger height, the blocking structure can also support subsequent film layers, avoiding the damage of the display panel caused by excessive pressure between film layers.

In an embodiment of the present disclosure, still referring to FIG. 17, the light emitting region DA1 includes a first light emitting region DA11 and a second light emitting region DA12 adjacent to each other. The wavelength of light in the first light emitting region DA11 is greater than the wavelength of light in the second light emitting region DA12. The minimum distance d1 from the scattering structure 140 to the first light emitting region DA11 is greater than the minimum distance d2 from the scattering structure 140 to the second light emitting region DA12. In the same medium, the light refractivity of a medium gradually decreases as the light wavelength increases. Therefore, in the same medium, red light has the smallest refractivity, while blue light has the largest refractivity among visible light. In view of this, the first light emitting region DA11 may be a red light emitting region DAR, and the second light emitting region may be a blue light emitting region DAB. When light propagates in the same medium, blue light is more likely to be totally reflected. Therefore, the distance between the scattering structure and a blue pixel opening is designed to be smaller, and this improves the light emission efficiency of blue light and avoids the color cast problem of the display panel caused by different light emission amounts at a front viewing angle, thereby improving the display quality of the display panel.

Figure 21:
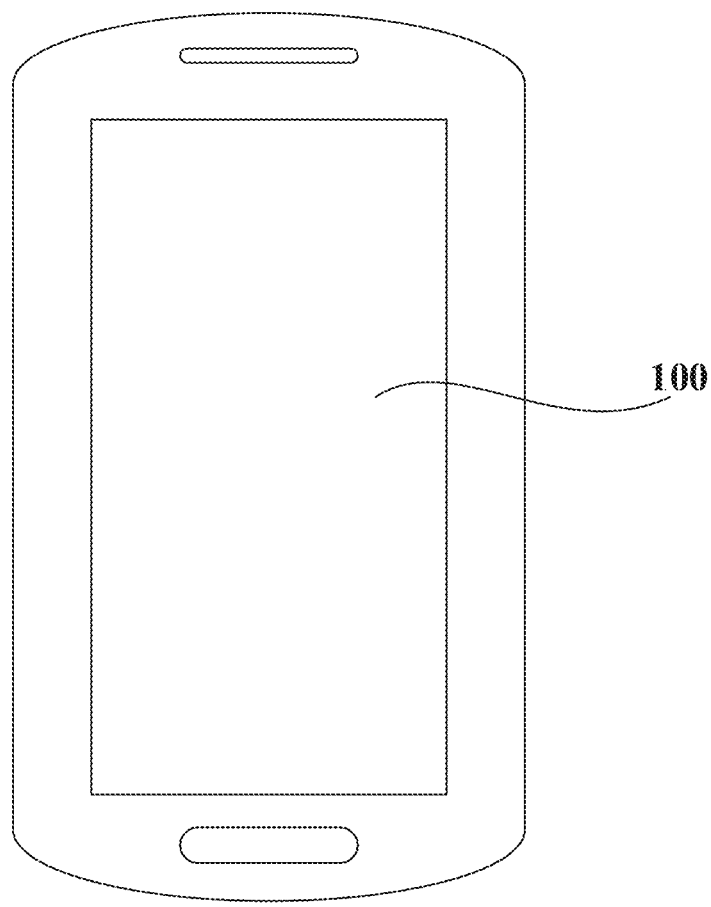
FIG. 21 is a structural diagram of a display device according to the present disclosure.

In view of the same concept, the present disclosure further provides a display device. FIG. 21 is a structural diagram of a display device 10 according to the present disclosure. The display device 10 includes a display panel 100. The display panel 100 is any one of the display panels provided in the above embodiments of the present disclosure. For embodiments of the display device 10 of this embodiment of the present application, refer to the embodiments of the display panels 100 described above, and what has been described are not repeated here. In the present application, the display device 10 may be any product or component having a display function, such as a mobile phone, a tablet computer, a television, a display, a notebook computer, a digital photo frame or a navigator.

The present disclosure provides a display panel and a display device. The display panel includes a display region, a substrate, a display function layer, a first function layer, a scattering structure and a light shielding structure. The display region includes a light emitting region and a non-light emitting region. The non-light emitting region surrounds the light emitting region. The display function layer is located on a side of the substrate. The first function layer is located on a side of the display function layer facing away from the substrate. The scattering structure is located between the display function layer and the first function layer in a direction perpendicular to a plane where the substrate is located. The scattering structure and the light shielding structure are located in the non-light emitting region. The light shielding structure at least overlaps with the scattering structure in the direction perpendicular to the plane where the substrate is located. In the present disclosure, the light scattering structure is disposed on a light emitting side of the display panel. In conjunction with the light shielding function layer, this improves the light emission efficiency of the display panel, thereby helping to reduce the power consumption of the display panel and reduces the light emission rate of the display panel, thereby improving the display effect of the display panel.

What is claimed is:

1. A display panel, comprising:
a substrate;
a display function layer, which is located on a side of the substrate;
a first function layer, which is located on a side of the display function layer facing away from the substrate;
a scattering structure, which is located between the display function layer and the first function layer in a first direction, wherein the first direction is perpendicular to a plane where the substrate is located; and
a light shielding structure, which at least overlaps with the scattering structure in the first direction;
wherein the display panel has a display region, the display region comprises a light emitting region and a non-light emitting region surrounding the light emitting region; and the scattering structure is located in the non-light emitting region, and the light shielding structure is located in the non-light emitting region;
wherein the light shielding structure comprises a first light shielding sub-structure, and the first light shielding sub-structure is located on a side of the scattering structure close to the substrate; or,
the light shielding structure comprises a second light shielding sub-structure, and the second light shielding sub-structure is located on a side of the scattering structure facing away from the display function layer, and the light shielding structure further comprises a first light shielding sub-structure, the first light shielding sub-structure is located on a side of the scattering structure away from the second light shielding sub-structure.

2. The display panel of claim 1, wherein if the light shielding structure comprises the first light shielding sub-structure, and the first light shielding sub-structure is located on a side of the scattering structure close to the substrate, the first function layer is a polarizer.

3. The display panel of claim 2, wherein the first light shielding sub-structure is located between the scattering structure and the display function layer in the first direction.

4. The display panel of claim 2, wherein an orthographic projection of the scattering structure onto the substrate falls into an orthographic projection of the first light shielding sub-structure onto the substrate.

5. The display panel of claim 1, further comprising a pixel definition layer, the pixel definition layer comprises a pixel definition structure and a pixel opening, the pixel definition structure is located in the non-light emitting region, the pixel opening is located in the light emitting region, the pixel definition structure comprises a light shielding material, and the pixel definition structure also functions as the light shielding structure.

6. The display panel of claim 1, comprising an encapsulation layer, wherein the encapsulation layer is located between the first function layer and the display function layer in the first direction and comprises at least one inorganic encapsulation layer and at least one organic encapsulation layer, wherein the at least one inorganic encapsulation layer comprises a first inorganic encapsulation layer, the at least one organic encapsulation layer is located on a side of the first inorganic encapsulation layer away from the display function layer, and the scattering structure is located between the first inorganic encapsulation layer and the at least one organic encapsulation layer.

7. A display panel, comprising:
a substrate;
a display function layer, which is located on a side of the substrate;
a first function layer, which is located on a side of the display function layer facing away from the substrate;
a scattering structure, which is located between the display function layer and the first function layer in a first direction, wherein the first direction is perpendicular to a plane where the substrate is located; and
a light shielding structure, which at least overlaps with the scattering structure in the first direction;
wherein the display panel has a display region, the display region comprises a light emitting region and a non-light emitting region surrounding the light emitting region; and the scattering structure is located in the non-light emitting region, and the light shielding structure is located in the non-light emitting region; and the display panel further comprising an encapsulation layer, wherein the encapsulation layer is located between the first function layer and the display function layer in the first direction and comprises at least one inorganic encapsulation layer and at least one organic encapsulation layer, wherein the at least one inorganic encapsulation layer comprises a first inorganic encapsulation layer, the at least one organic encapsulation layer is located on a side of the first inorganic encapsulation layer away from the display function layer, and the at least one organic encapsulation layer comprises a first part, wherein the first part is located in the non-light emitting region, comprises scattering particles, and also functions as the scattering structure.

8. The display panel of claim 1, wherein if the light shielding structure comprises the second light shielding sub-structure, and the second light shielding sub-structure is located on the side of the scattering structure facing away from the display function layer, the first function layer is a color film layer, the color film layer comprises a color resist, and an orthographic projection of the color resist onto the substrate covers at least the light emitting region.

9. The display panel of claim 8, wherein if the light shielding structure comprises the first light shielding sub-structure, the first light shielding sub-structure is located on the side of the scattering structure away from the second light shielding sub-structure, an orthographic projection of the scattering structure onto the substrate falls into an orthographic projection of the first light shielding sub-structure onto the substrate.

10. The display panel of claim 9, wherein the display panel comprises a pixel definition layer, wherein the pixel definition layer comprises a pixel definition structure and a pixel opening, the pixel definition structure is located in the non-light emitting region, and the pixel opening is located in the light emitting region;

the pixel definition structure comprises a first pixel definition structure, the pixel opening comprises a first pixel opening, the first pixel definition structure is adjacent to the first pixel opening, each of the first light shielding sub-structure, the second light shielding sub-structure and the scattering structure overlaps with the first pixel definition structure; and in a first cross section of the display panel, a minimum distance from the first light shielding sub-structure to the first pixel opening is D1, a minimum distance from the second light shielding sub-structure to the first pixel opening is D2, and a minimum distance from the scattering structure to the first pixel opening is D3, wherein the first cross section is perpendicular to the plane where the substrate is located and parallel to a direction from the first pixel definition structure to the first pixel opening, and D1<D3<D2.

11. The display panel of claim 10, wherein in a second direction which is parallel to the plane where the substrate is located, a width of the first light shielding sub-structure is L11, a width of the second light shielding sub-structure is L12, and a width of the scattering structure is L21, wherein L11−L21<L21−L12.

12. The display panel of claim 1, wherein an included angle between a side surface of the scattering structure close to the light emitting region and a bottom surface of the scattering structure is an acute angle.

13. The display panel of claim 1, comprising a touch function layer, wherein the touch function layer is located on the side of the display function layer away from the substrate, the touch function layer comprises a touch medium layer, and the scattering structure is disposed in a same layer as the touch medium layer.

14. A display panel, comprising:
a substrate;
a display function layer, which is located on a side of the substrate;
a first function layer, which is located on a side of the display function layer facing away from the substrate;
a scattering structure, which is located between the display function layer and the first function layer in a first direction, wherein the first direction is perpendicular to a plane where the substrate is located; and
a light shielding structure, which at least overlaps with the scattering structure in the first direction;
wherein the display panel has a display region, the display region comprises a light emitting region and a non-light emitting region surrounding the light emitting region; and the scattering structure is located in the non-light emitting region, and the light shielding structure is located in the non-light emitting region; and
the display panel further comprising a blocking structure, wherein the blocking structure is located in the non-light emitting region, the blocking structure is located on the side of the display function layer away from the substrate, and a light transmittance of the blocking structure is T, where T<1%.

15. The display panel of claim 14, wherein the first function layer is a color film layer, the color film layer comprises a color resist, and an orthographic projection of the color resist onto the substrate covers at least the light emitting region; wherein the blocking structure is located between the color film layer and the display function layer; and wherein the light shielding structure comprises a second light shielding sub-structure, the second light shielding sub-structure is located on a side of the scattering structure facing away from the display function layer, and an orthogonal projection of the second light shielding sub-structure onto the substrate overlaps with an orthogonal projection of the blocking structure onto the substrate.

16. The display panel of claim 14, wherein the blocking structure comprises a reflective material, a side surface of the blocking structure close to the light emitting region is a reflective surface, and an included angle between the reflective surface and the substrate is an acute angle.

17. The display panel of claim 14, wherein the light emitting region comprises a first light emitting region, a second light emitting region, and a first non-light emitting region; wherein the first non-light emitting region is located between the first light emitting region and the second light emitting region; in the first non-light emitting region, the scattering structure comprises a first scattering sub-structure and a second scattering sub-structure; and the blocking structure is located between the first scattering sub-structure and the second scattering sub-structure in a direction from the first light emitting region to the second light emitting region.

18. The display panel of claim 1, wherein a first functional film layer is a cover plate, and the scattering structure is located between the light shielding structure and the cover plate in the first direction.

19. The display panel of claim 1, wherein the light emitting region comprises a first light emitting region and a second light emitting region adjacent to each other, a wavelength of light emitted from the first light emitting region is greater than a wavelength of light emitted from the second light emitting region, and a minimum distance from the scattering structure to the first light emitting region is greater than a minimum distance from the scattering structure to the second light emitting region.

20. A display device, comprising the display panel of claim 1.

* * * * *